(12) United States Patent
Deguet et al.

(10) Patent No.: US 9,991,439 B2
(45) Date of Patent: Jun. 5, 2018

(54) METHOD FOR IMPLANTING A PIEZOELECTRIC MATERIAL

(75) Inventors: Chrystel Deguet, Grenoble (FR); Nicolas Blanc, Bourg-de-Peage (FR); Bruno Imbert, Grenoble (FR); Jean-Sebastien Moulet, Chambery (FR)

(73) Assignees: Commissariat à l'énergie atomique et aux énergies alternatives, Paris (FR); SOITEC, Bernin (FR)

( * ) Notice: Subject to any disclaimer, the term of this patent is extended or adjusted under 35 U.S.C. 154(b) by 1307 days.

(21) Appl. No.: 13/808,703

(22) PCT Filed: Jul. 5, 2011

(86) PCT No.: PCT/EP2011/061290
§ 371 (c)(1),
(2), (4) Date: Jan. 7, 2013

(87) PCT Pub. No.: WO2012/004250
PCT Pub. Date: Jan. 12, 2012

(65) Prior Publication Data
US 2013/0111719 A1    May 9, 2013

(30) Foreign Application Priority Data
Jul. 6, 2010 (FR) ..................... 10 55478

(51) Int. Cl.
*H01L 41/22* (2013.01)
*H01L 41/313* (2013.01)
(Continued)

(52) U.S. Cl.
CPC ............ *H01L 41/22* (2013.01); *H01L 41/313* (2013.01); *H03H 3/02* (2013.01); *H03H 9/131* (2013.01); *Y10T 29/42* (2015.01)

(58) Field of Classification Search
CPC ......... H01L 41/22; H01L 41/25; H01L 41/31; H01L 41/311; H01L 41/313; H03H 3/08; H03H 3/02; H03H 9/131; Y10T 29/42
See application file for complete search history.

(56) References Cited

U.S. PATENT DOCUMENTS 5,374,564 A    12/1994  Bruel
5,384,268 A *   1/1995  Lur .................. H01L 21/2652
                                         257/E21.334
(Continued)

FOREIGN PATENT DOCUMENTS

CN    1989594 A    6/2007
FR    2 681 472    3/1993
(Continued)

OTHER PUBLICATIONS

G. Dearnaley, "Ion Implantation," Annual Review of Materials Science, vol. 4: 93-123 (Volume publication date Aug. 1974).*
(Continued)

*Primary Examiner* — Livius R Cazan
(74) *Attorney, Agent, or Firm* — Oblon, McClelland, Maier & Neustadt, L.L.P.

(57) ABSTRACT

A method of producing a structure made of a piezoelectric material, including: a) production of a stack including at least one metal layer and at least one conductive layer on a substrate made of piezoelectric material, wherein at least one electrical contact is established between the conductive layer and a metal element outside the stack; b) an ionic and/or atomic implantation, through the conductive layer and the metal layer; c) transfer of the substrate onto a transfer substrate, followed by fracturing of the transferred piezoelectric substrate, in an embrittlement area.

18 Claims, 4 Drawing Sheets

(51) Int. Cl.
*H03H 9/13* (2006.01)
*H03H 3/02* (2006.01)

(56) References Cited

U.S. PATENT DOCUMENTS

| | | |
|---|---|---|
| 6,767,749 B2 | 7/2004 | Kub et al. |
| 2003/0199105 A1 | 10/2003 | Kub et al. |
| 2008/0254596 A1 | 10/2008 | Aspar et al. |
| 2010/0088868 A1 | 4/2010 | Kando et al. |
| 2010/0216294 A1 | 8/2010 | Rabarot et al. |

FOREIGN PATENT DOCUMENTS

| | | | |
|---|---|---|---|
| JP | 58100410 A | * | 6/1983 |
| JP | 60-57671 A | | 4/1985 |
| JP | 4-3919 A | | 1/1992 |
| JP | 4-130626 A | | 5/1992 |
| WO | WO 2009/087290 A1 | | 7/2009 |

OTHER PUBLICATIONS

M. Pijolat et al., "Mode conversion in high overtone bulk acoustic wave resonators," 2009 IEEE International Frequency Control Symposium Joint with the 22nd European Frequency and Time forum, Besancon, Apr. 20-24, 2009, pp. 290-294.*

Pijolat et al., "LiNbO3 Film Bulk Acoustic Resonator," 2010 IEEE International Frequency Control Symposium, Newport Beach, CA, 2010, pp. 661-664.*

A. Tauzin et al., "3-inch single-crystal LiTaO3films onto metallic electrode using Smart CutTMtechnology," in Electronics Letters, vol. 44, No. 13, pp. 822-824, Jun. 19, 2008.*

French Preliminary Search Report dated Feb. 8, 2011, in Patent Application No. FR1055478 (FA 740221).

M. Pijolat, et al., "Mode conversion in High overtone Bulk Acoustic wave Resonators", Joint Meeting of the European Frequency and Time Forum and the IEEE International Frequency Control Symposium, Apr. 20-24, 2009, XP031492385, pp. 290-294.

M. Levy, et al., "Fabrication of single-crystal lithium niobate films by crystal ion slicing", Applied Physics Letters, vol. 73, nb 16, 1998, 3 pages (2293).

Young-Bae Park, et al., "Integration of Single-Crystal LiNbO3 Thin Film on Silicon by Laser Irradiation and Ion Implantation-Induced Layer Transfer", Advanced Materials, vol. 18, 2006, pp. 1533-1536.

Qing Wan, et al., "Investigation of $H^+$ and $B^+/H^+$ implantation in $LiTaO_3$ single-crystals", Nuclear Instruments and Methods in Physics Research B 184, 2001, pp. 531-535.

Subramanian S. Iyer, et al., "Silicon Wafer Bonding Technology for VLSI and MEMS application", INSPEC, London, Chapter 3, ("Smart Cut: the technology used for high volume SOI wafer production" by B. Aspar, et al.) 2002, 23 pages.

Q.-Y. Tong "Principles of wafer bonding",Subramanian S. Iyer, et al., "Silicon Wafer Bonding Technology for VLSI and MEMS application", INSPEC, London, Chapter 1, 2002, 20 pages.

Ionut Radu, et al., "Ferroelectric Oxide Single-Crystalline Layers by Wafer bonding and Hydrogen/Helium Implantation", Mat. Res. Soc. Symp. Proc., vol. 748, 2003, 6 pages.

Japanese Office Action dated Aug. 31, 2015 in Patent Application No. 2013-517355 (with English Translation).

Korean Office Action dated Mar. 17, 2017 in Korean Patent Application No. 10-2013-7002500 w/translation.

* cited by examiner

METHOD FOR IMPLANTING A PIEZOELECTRIC MATERIAL

TECHNICAL FIELD AND PRIOR ART

The growth of radiofrequency telecommunications for some ten years has led to congestion of the authorised frequency bands. To take advantage of the available frequency ranges systems must include band filtering, with a narrow transition band. Only SAW (surface acoustic wave) or BAW (bulk acoustic wave) technology resonators, using the piezoelectric properties of the materials, enable these specifications to be met with low losses and a compact configuration. Currently, piezoelectric layers used for these filters are made by deposition (BAW filters) or from bulk substrates (SAW filters).

A BAW is represented schematically in FIG. 1: it includes a fine piezoelectric layer 2 of the order of 1 µm thick positioned between two electrodes 4, 6.

The assembly rests on a substrate 12, but may be insulated acoustically by means 10. The acoustic insulation may be obtained either by suspending the piezoelectric film above a cavity (FBAR technology), or by separating it from the substrate by a Bragg network (SMR technology).

The layers of piezoelectric materials for this type of device are generally produced by deposition techniques of the PVD type. By this means layers are produced which are between several hundred nm and one µm thick.

In addition to the deposition techniques, techniques of transfer after implantation have formed the subject of various studies.

The document entitled "fabrication of single-crystal lithium niobate films by crystal ion slicing", of M. Levy et al., Applied Physics Letters, vol 73, nb 16 (1998) 2293 describes an example of a high-energy implantation (3.8 MeV) for a dose of $5 \times 10^{16}$ He$^+$ ions/cm$^2$, enabling a thick layer of LiNbO$_3$ of the order of 9 µm to be transferred. However, due to the implantation energies used, which are of several MeV, it is difficult to industrialise this technique, and transfer of thin film (less than one micrometer) has not been demonstrated.

Another study, entitled "Integration of single-crystal LiNbO3 thin film on silicon by laser irradiation and ion implantation-induced layer transfer", by Y. B. Park et al., Advanced Materials, vol 18 (2006) 1533, describes other conditions in terms of implantation. This document shows the transfer of 800 nm of LiNbO3 by co-implantation of H$^+$ ions at 80 keV with a dose of $5 \times 10^{16}$ ions/cm$^2$ and of helium at 115 keV with a dose of $10^{17}$ ions/cm$^2$. In this document, the transfer is accomplished using a cw-CO$_2$ laser (of power density 100 MW·m$^{-2}$) used as a heat source.

Document US 2010/0088868A1 and the article of Q. Wan et al. entitled "Investigation of H+ and B+/H+ implantation in LiTaO3 single crystals", Nuclear Instruments and Methods in Physics Research", B 184 (2001) p. 53 also describes the formation of layers made of LiTaO$_3$ and LiNbO$_3$ by transfer.

But none of the known techniques enables an elementary stack including a piezoelectric layer and a buried metal layer to be transferred.

Formation of such an elementary stack would however be necessary with a view to producing other components made from piezoelectric material, for example filters such as those presented above, but also possibly other types of components.

DESCRIPTION OF THE INVENTION

The invention firstly proposes a method of producing a structure made of a piezoelectric material, including:

a) production of a stack including at least one metal layer and/or at least one surface layer which is conductive in electrical terms on a substrate made of piezoelectric material, for example LiNbO$_3$ or LiTaO$_3$, where at least one electrical contact is established between the conductive layer and a metal element outside the stack, b) an implantation of one or more gaseous species, through at least the said conductive layer and the metal layer, to form an embrittlement area in the piezoelectric substrate, c) an assembly of the stack obtained in this manner with a transfer substrate, followed by fracturing of the piezoelectric substrate, in the embrittlement area, to form an assembly including at least one layer made of piezoelectric material, a metal layer and the transfer substrate.

The invention thus proposes a method enabling a substrate to be produced having a buried electrode (which can be constituted by the metal layer) and a piezoelectric surface layer, obtained for example from a bulk substrate of piezoelectric material, for example of LiNbO$_3$ or LiTaO$_3$ type.

The layer which is conductive in electrical terms is also advantageously conductive in thermal terms.

Implantation, preferably at an energy level of below 500 keV, is accomplished through a metal layer which is buried beneath at least one surface conductive layer. Without this surface conductive layer on the path of the implantation beam, the inventors observed that fracturing could not be obtained, or even that the plates obtained broke during implantation.

Among the metals which can be used as a surface conductive layer are notably the transition metals (including Mo, or Ni, or Pt, or Cr, or Ru, or Ti, or W, or Co, Ta, Cu) or poor metals (including Al, or Sn, or Ga, etc.) and their alloys. AlSi or again AlCu are also included. The metal used preferably has a thermal and electrical conductivity greater than, respectively, 10 W/m·K and $10^6$ Siemens/m (for Ti: 21 W/m·K and $2.4 \times 10^6$ S/m)

With regard to the metal which can be used for the buried electrode: in addition to the previous parameters acoustic compatibility may be added (acoustic impedance greater than $1 \times 10^5$ g/cm$^2$·s; in the case of Al this is $13.8 \times 10^5$ g/cm$^2$·s) to the previously cited list (in particular if the application referred to is that of an RF filter).

It preferably has a squared electrical resistivity of less than 10Ω, or again of less than 1Ω.

Either one of the metal layer and of the conductive layer can be between 10 nm and 200 nm thick.

A method according to the invention may also include, before step b), a step of densification of the materials of the stack.

In one embodiment, the metal layer and the surface conductive layer form a single, unique layer.

It is then possible, after the step of implantation and before the step of bonding, to eliminate a proportion of the thickness of the metal layer.

In another embodiment the buried metal layer and the surface conductive layer form separate layers. It is then possible to eliminate the surface conductive layer after step b) of implantation and before step c) of assembly. In this case the method may include, in addition, the formation of a bonding layer or sacrificial layer, or of a Bragg network, on the said metal layer.

At least one bonding layer may be formed on the substrate made of piezoelectric material and/or the transfer substrate to facilitate assembly. As a variant, the metal layer may be prepared to fulfill this function.

An electrical contact may advantageously be established between the metal layer and either the conductive layer or a metal element external to the stack. This external metal element may form part of the implantation device; it may be a substrate supporting the implantation device on which the stack is positioned with a view to implantation.

BRIEF DESCRIPTION OF THE ILLUSTRATIONS

DETAILED ACCOUNT OF THE EMBODIMENTS OF THE INVENTION

A method according to the invention uses a substrate made of a piezoelectric material.

In this document, mention is made on several occasions of a method of transferring a thin film based on a technique of implantation and of fracturing. Such a method is described, for example, in patent FR 2681472 or the article by B. Aspar and A. J. Auberton-Hervé "Silicon Wafer Bonding Technology for VLSI and MEMS applications", edited by S. S. Iyer and A. J. Auberton-Hervé, 2002, INSPEC, London, Chapter 3, pages 35-52.

In the remainder of this document reference is also made to molecular bonding, also called direct bonding. This assembly technique is described notably by Q. Y. Tong in "Silicon Wafer Bonding Technology for VLSI and MEMS applications", Edited by S. S. Iyer and A. J. Auberton-Hervé, 2002, INSPEC, London, Chapter 1, pages 1-20.

The piezoelectric material in question below is, for example, chosen from among berlinite ($AlPO_4$), zinc oxide (ZnO), quartz, topaz, gallium orthophosphate ($GaPO_4$ crystal), langasite ($La_3Ga_5SiO_{14}$), barium titanate ($BaTiO_3$ crystal), or lead titanate ($PbTiO_3$), or lead zirconate titanate ($Pb(ZrTi)O_3$) (PZT), or potassium niobate ($KNbO_3$), or lithium niobate ($LiNbO_3$), or lithium tantalate ($LiTaO_3$), or sodium tungstate ($NaxWO_3$), or $Ba_2NaNb_5O_5$, or $Pb_2KNb_5O_{15}$.

Figure 4A:
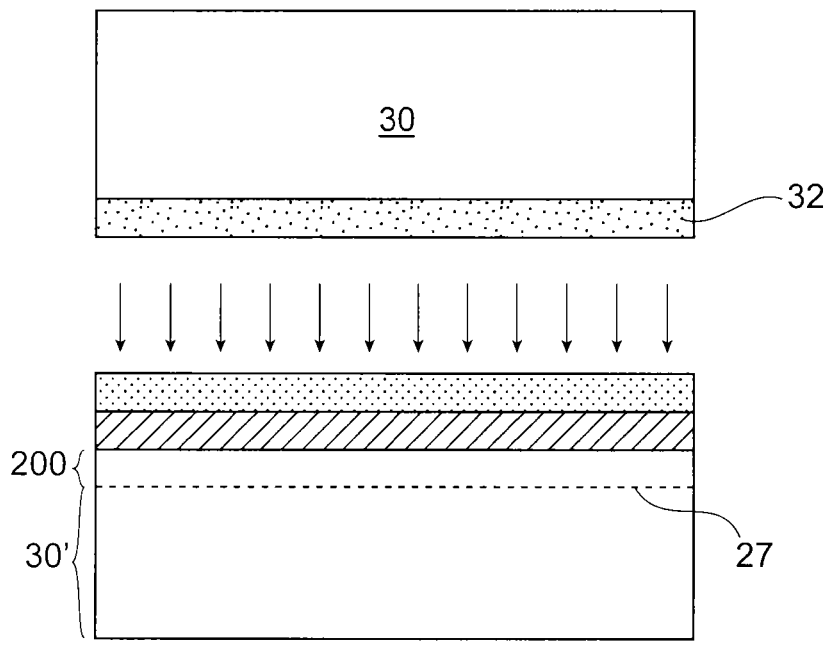
FIGS. 4A and 4B represent steps of transfer, on to a transfer substrate, of a layer made of piezoelectric material with a buried electrode.
Figure 4B:
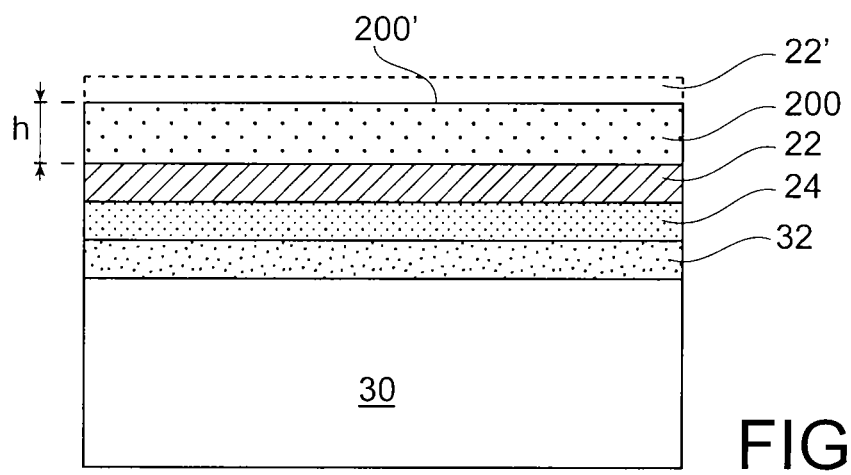

An example of a device according to the invention, or obtained by a method according to the invention, is illustrated in FIG. 4B.

In this structure, a thin layer 200 of piezoelectric material lies on a buried metal electrode 22. The assembly itself lies on a host substrate 30. A bonding area, possibly including one or more bonding layers 24, 32, connects substrate 30 and metal electrode layer 22. As a variant, the metal electrode is directly assembled on substrate 30.

In other words, this stack includes, in this order:
substrate 30,
possibly one or more bonding layers,
electrode 22,
and finally piezoelectric layer 200, made of a material such as one of those indicated above.

Other unrepresented layers (for example forming a Bragg mirror or sacrificial layer, etc.) may be included between substrate 30 and electrode 22.

Use of a method according to the invention will now be described, in connection with FIGS. 2A-2E.

This concerns the production of a substrate of the type of that of FIG. 4B, in which layer 200 of piezoelectric material, for example $LiNbO_3$, has been transferred on to any base 30 with a buried metal electrode.

A bulk piezoelectric substrate 20 (for example of the $LiNbO_3$ type, or $LiTaO_3$ type, etc.) is chosen. The material, and notably its crystalline alignment, will be chosen in accordance with the sought application.

Figure 1:
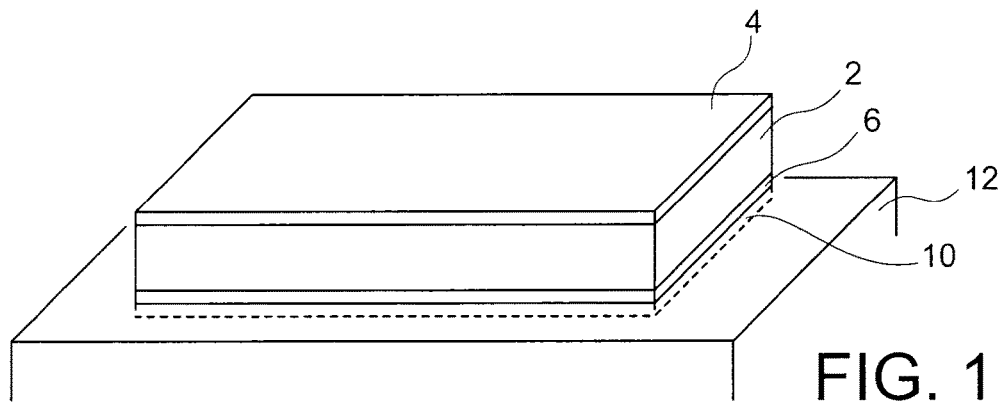
FIG. 1 represents a component of the BAW type.
Figure 2A:
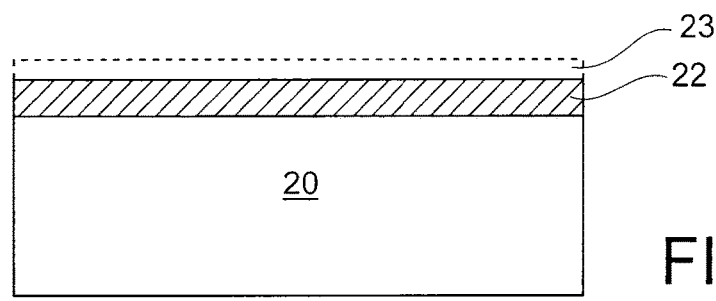
FIGS. 2A to 2E represent steps in the preparation of a first substrate, according to a method according to the invention.

A metal layer 22 is formed on one face of this substrate 20 (FIG. 2A).

This layer 22 may be a simple metal layer, which will form a buried electrode. As a variant, at least one additional layer 23 (shown with a dotted line in FIG. 2A) is also formed on this layer 22. This additional layer may be, for example, a sacrificial layer or alternatively a Bragg network (which may include alternating layers of $W/SiO_2$), the role of which, as previously described, will ultimately be (notably after localised elimination of the sacrificial layer) to insulate acoustically the piezoelectric layer from the substrate.

The metal of metal layer 22 may be, for example, chosen from among one of the following metals: Cu, AlCu, AlSi, W, Mo, Pt, Cr, etc. Other examples of materials and of selection criteria were given above (thermal and/or electrical conductivity greater than, respectively, 10 W/m·K and/or $10^6$ Siemens/m and/or having an acoustic impedance of greater than $1 \times 10^5$ g/cm$^2$·s).

Figure 2B:
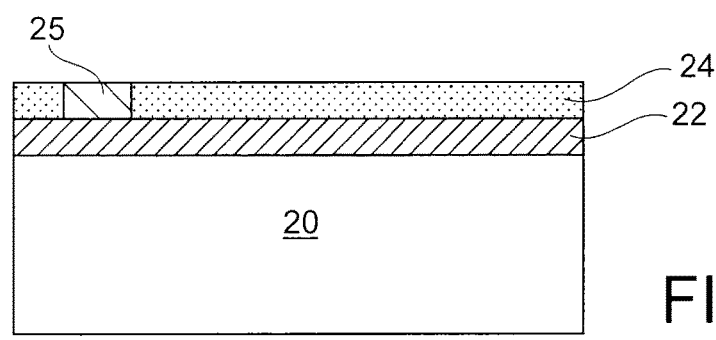
Figure 2C:
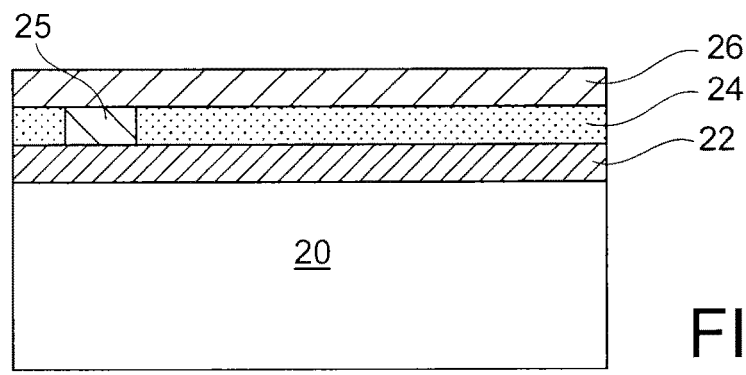

The stack assembly constituted by substrate 20 and layer 22 (and, if applicable, additional layer 23) is then, in this example, covered with a layer 24, called the bonding layer (FIG. 2B). It may be made of an electrically and/or thermally insulating material.

It is, for example, a layer of silicon dioxide ($SiO_2$), some several hundreds of nm thick, for example between 10 nm and 500 nm, again, for example, equal to approximately 200 nm. As a variant, the role of the bonding layer may be provided directly by metal layer 22 intended to form the electrode.

A conductive layer 25 may possibly be produced in bonding layer 24, for example by etching this layer 24 followed by deposition of the appropriate conductive material. The function of this area 25 will be explained below.

A layer 26 which is at least electrically conductive, is then deposited (FIG. 2C) on bonding layer 24. This layer is also advantageously thermally conductive. It may be, for example, a layer made of Mo, or Ti, or Al, or AlSi, or AlCu, or W. Its electrical conduction properties give it a squared resistivity of less than approximately 10Ω. A squared resistance of less than approximately 1 Ω or of the order of 0.5 Ω will advantageously be taken. Thus, if a material of resistivity 5 μΩ·cm is taken, a thickness of 100 nm will be suitable for this layer. More generally, this layer is preferably between approximately 10 nm and 200 nm thick. The thermal conductivity of this layer is advantageously greater than 10 W/m·K and preferentially close to 50 W/m·K.

As a variant, the role of the conductive surface layer may be taken directly by metal layer 22, intended to form the electrode, notably if the latter has the required conduction properties previously defined for the conductive layer. It is then covered with no additional layer, and therefore also acts as the bonding layer.

The stack produced may be densified, before or after the deposition of this conductive layer 26, depending on the nature of the materials deposited, for example by thermal treatment at a temperature of between 300° C. and 600° C. for several hours.

This stack is brought into contact with substrate 29, generally made of aluminium, which supports an implantation device (FIG. 2E): at least one contact 31 is established between conductive layer 26 and the surface of this supporting substrate 29, or any other element which may act as an electrical ground reference.

This contact 31 may be established by means of an at least partially electrically conductive arm which also acts to hold the stack mechanically on supporting substrate 29. In this case, the contact may be established with a slight mechanical pressure of the arm on the stack, by this means also enabling the stack to be held vertically during the implantation step.

Figure 2D:
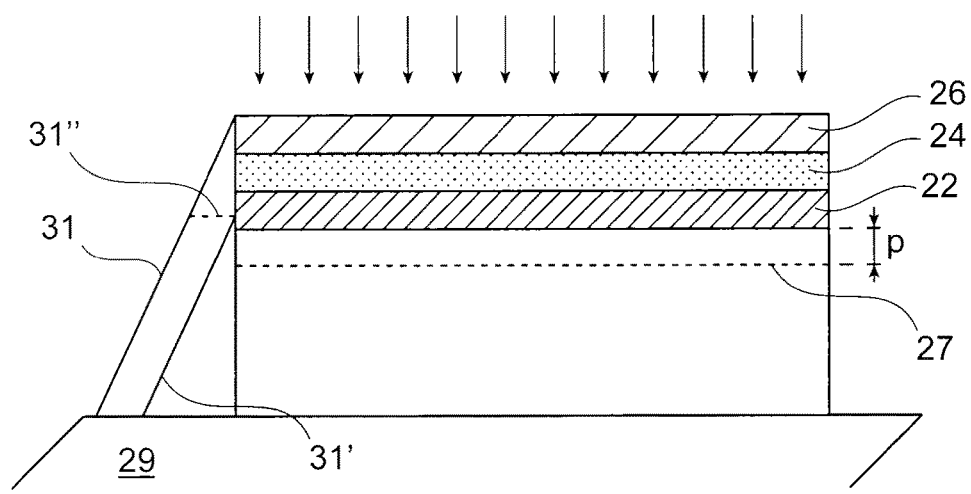

Another contact 31' may be established between electrode layer 22 and support 29. As a variant, a contact 31" may be established between this layer 22 and contact 31 (it is represented in FIG. 2D with dashed lines).

This or these contact(s) allow electrical conductivity to be provided between layer 22 and/or layer 26 and an element outside the stack which is used as an electrical ground reference.

According to yet another variant, the electrical contact between electrode layer 22 and conductive layer 26 may be obtained by means of a conductive area 25 produced in the bonding layer in the step previously described in connection with FIG. 2B.

Figure 2E:
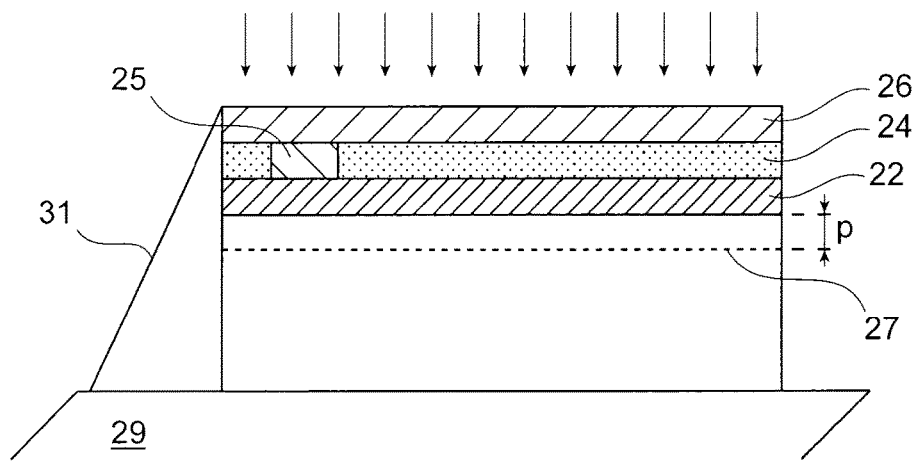

One or more gaseous species are then implanted, preferably at least helium in the case of LiNbO$_3$, at an average depth p close to the thickness desired for thin layer 200 of piezoelectric material to be transferred (FIG. 2E). An embrittlement area 27 is formed by this means. The implantation depth may be of any value, depending on the energy of the implantation beam.

For example, the implantation accomplished may use helium or hydrogen, or of a blend of hydrogen and helium, with doses of between $10^{16}$ at/cm$^2$ and $10^{17}$ at/cm$^2$, and with an energy value of between 50 keV and 240 keV, depending on the thickness to be transferred.

After this implantation, conductive layer 26 is removed, for example by a chemical etching technique, or by dry etching or by polishing. A selective etching technique will advantageously be chosen to etch the conductive layer without etching the underlying layer (bonding layer 24 or metal layer 22, as applicable).

If metal layer 22 is acting as surface conductive layer 26, it may be partially etched over a portion of its thickness, in order to eliminate a surface portion which might have been damaged by the implantation step.

Figure 3:
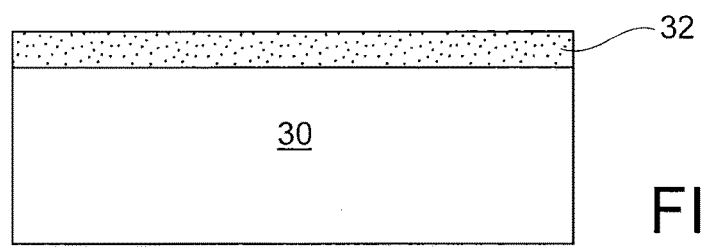
FIG. 3 represents the preparation of a transfer substrate.

In addition, a second substrate 30 is prepared (which may be piezoelectric, for example made of LiNbO$_3$ or another substance, for example silicon or sapphire or quartz, etc.), on a surface of which layers of interest (layers forming a Bragg mirror or sacrificial layer, for example) may be deposited, together with, possibly, a bonding layer 32, preferably a dielectric layer, for example made of SiO$_2$ (FIG. 3). Here again, this bonding layer may be between 10 nm and 500 nm thick; it is preferably close to 200 nm.

Both substrates prepared in this manner can subsequently be subject to a specific treatment with a view to bonding: the surfaces intended to be brought into contact and then assembled are subject, for example, to a mechano-chemical polishing (of the CMP type). This treatment notably enables the roughness desired for the bonding to be obtained, together with adequate surface activation.

The two substrates are then bonded by direct bonding (FIG. 4A). Bonding layers 24, 32 and/or the faces having been subject to a specific treatment with a view to a bonding are brought into contact with one another.

By thermal treatment, possibly assisted by application of a mechanical force, the transfer of piezoelectric thin film 200 is initiated, by fracturing along embrittlement area 27 (FIG. 4B). For example, a thermal treatment is implemented at between 100° C. and 500° C., preferentially around 250° C., in order to initiate the transfer of thin film 200. This thermal treatment enables the microcavities formed during the implantation step in area 27 to be developed, which causes the desired fracturing. The presence of the conductive layer during the implantation step enables this transfer to be obtained without breaking the stack.

A method of finishing the surface of the layer or of film 200 (such as a thermal treatment and/or polishing to obtain roughness compatible with the subsequent production of components on the surface of this layer 200) may be undertaken.

By this means a fine layer 200 of piezoelectric material is obtained with a buried metal electrode 22 on a host substrate 30. A bonding area, defined by layers 24, 32, may connect substrate 30 and metal electrode layer 22. As previously mentioned, there can also be other layers between the electrode layer and the host substrate. In other words, a stack including at least substrate 30 is obtained, on which a bonding area is formed, consisting of both layers 24, 32, on which electrode 22 is positioned, on which piezoelectric layer 200 is positioned.

In particular, it is possible to produce, on surface 200' of layer 200, a second electrode 22' (shown in dotted lines in FIG. 4B).

In addition, portion 30' of substrate 20 which was removed following the fracturing can be reused to form another layer of piezoelectric material.

The invention claimed is:

1. A method for producing a structure made of a piezoelectric material, the method comprising:
   producing a stack including at least one buried metal layer and at least one electrically conductive surface layer on a substrate made of piezoelectric material, wherein at least one electrical contact is established between the conductive surface layer and the metal layer and a metal element outside the stack to establish a ground reference;
   implanting one or more gaseous species, through an upper surface of the at least one electrically conductive surface layer and the at least one buried metal layer, to form an embrittlement area in the piezoelectric substrate; and
   assembling the stack with a transfer substrate, followed by fracturing of the substrate made of the piezoelectric material, in the embrittlement area, to form a stack including at least one layer made of the piezoelectric material, the metal layer, and the transfer substrate.

2. The method according to claim 1, wherein the at least one electrically conductive surface layer is also thermally conductive.

3. The method according to claim 1, wherein the at least one electrically conductive surface layer is made of a material selected from the group consisting of:
   a metal selected from the group consisting of Mo, Ni, Pt, Cr, Ru, Ti, W, Co, Ta, Cu, Al, Sn, and Ga;
   an alloy of said metals; and
   a material having at least one of the following properties:
      a thermal conductivity greater than 10 W/m·K, an electrical conductivity greater than $10^6$ Siemens/m, and an acoustic impedance greater than $1·10^5$ g/cm$^2$·s.

4. The method according to claim 1, wherein the at least one electrically conductive surface layer has a squared resistivity lower than 10 Ω.

5. The method according to claim 1, wherein the at least one electrically conductive surface layer has a squared resistivity lower than 1 Ω.

6. The method according to claim 1, wherein the at least one electrically conductive surface layer is between 10 nm and 200 nm thick.

7. The method according to claim 1, further comprising, before the implanting, densifying materials of the stack.

8. The method according to claim 1, wherein the at least one electrically conductive surface layer is eliminated after the implanting and before the assembling.

9. The method according to claim 1, further comprising forming a bonding layer or sacrificial layer, or a Bragg network, on the at least one metal layer.

10. The method according to claim 1, wherein the metal element outside the stack is a substrate supporting the stack.

11. The method according to claim 1, further comprising forming a sacrificial layer, or a Bragg network, or a bonding layer, on the transfer substrate before assembly.

12. The method according to claim 1, wherein the piezoelectric material is made of $LiNbO_3$ or $LiTaO_3$.

13. A method for producing a structure made of a piezoelectric material, the method comprising:
producing a single layer, which simultaneously is a metal layer and an electrically conductive surface layer, on a substrate made of piezoelectric material, wherein at least one electrical contact is established between the single layer and a metal element outside the single layer to establish a ground reference;
implanting one or more gaseous species, through an upper surface of the single layer, to form an embrittlement area in the piezoelectric substrate; and
assembling the single layer with a transfer substrate, followed by fracturing of the substrate made of the piezoelectric material, in the embrittlement area, to form a stack including at least one layer made of the piezoelectric material, the single layer, and the transfer substrate.

14. The method according to claim 13, wherein, after the implanting and before the assembling, a proportion of thickness of the single layer is eliminated.

15. The method according to claim 13, wherein the metal element outside the single layer is a substrate supporting the single layer.

16. The method according to claim 13, further comprising forming a sacrificial layer, or a Bragg network, or a bonding layer, on the transfer substrate before assembly.

17. The method according to claim 13, wherein the piezoelectric material is made of $LiNbO_3$ or $LiTaO_3$.

18. A method for producing a structure made of a piezoelectric material, the method comprising:
producing a stack including at least one buried metal layer, at least one bonding layer, and at least one electrically conductive surface layer on a substrate made of piezoelectric material, wherein at least one electrical contact is established between the conductive surface layer and the metal layer and a metal element outside the stack through a conductive area formed in the bonding layer to establish a ground reference;
implanting one or more gaseous species, through an upper surface of the at least one electrically conductive surface layer and the at least one buried metal layer, to form an embrittlement area in the piezoelectric substrate; and
assembling the stack with a transfer substrate, followed by fracturing of the substrate made of the piezoelectric material, in the embrittlement area, to form a stack including at least one layer made of the piezoelectric material, the metal layer, the bonding layer, and the transfer substrate.

* * * * *